(12) United States Patent
Chen et al.

(10) Patent No.: US 9,397,027 B1
(45) Date of Patent: Jul. 19, 2016

(54) SACRIFICIAL PAD ON SEMICONDUCTOR PACKAGE DEVICE AND METHOD

(71) Applicant: Maxim Integrated Products, Inc., San Jose, CA (US)

(72) Inventors: Xiansong Chen, Allen, TX (US); Yi-Sheng A. Sun, San Jose, CA (US); Kumar Nagarajan, Cupertino, CA (US); Satbir Madra, Santa Clara, CA (US); Yong L. Xu, Plano, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/494,880

(22) Filed: Sep. 24, 2014

Related U.S. Application Data

(60) Provisional application No. 61/989,723, filed on May 7, 2014.

(51) Int. Cl.
| | |
|---|---|
| *H01L 23/48* | (2006.01) |
| *H01L 23/495* | (2006.01) |
| *H01L 23/31* | (2006.01) |
| *H01L 23/29* | (2006.01) |
| *H01L 21/56* | (2006.01) |

(52) U.S. Cl.
CPC .......... *H01L 23/49503* (2013.01); *H01L 21/56* (2013.01); *H01L 23/293* (2013.01); *H01L 23/3107* (2013.01); *H01L 23/49568* (2013.01)

(58) Field of Classification Search
CPC ................... H01L 23/49503; H01L 23/49568; H01L 23/3107; H01L 23/293; H01L 21/56
See application file for complete search history.

(56) References Cited

U.S. PATENT DOCUMENTS

| | | | | |
|---|---|---|---|---|
| 5,877,548 | A  * | 3/1999 | Washida et al. | 257/690 |
| 6,242,815 | B1 * | 6/2001 | Hsu et al. | 257/786 |
| 6,713,850 | B1 * | 3/2004 | Yuan et al. | 257/668 |
| 2006/0016619 | A1* | 1/2006 | Jang et al. | 174/260 |

* cited by examiner

*Primary Examiner* — Roy Potter
(74) *Attorney, Agent, or Firm* — Kevin E. West; Advent, LLP

(57) ABSTRACT

A semiconductor package device, electronic device, and fabrication methods are described that include at least one sacrificial contact pad as a portion of the semiconductor package device for preventing and reducing stress on the semiconductor package device and increasing board level reliability. In implementations, the semiconductor package device includes a lead frame substrate including at least one lead frame contact pad and at least one sacrificial contact pad, an integrated circuit device electrically coupled to the lead frame substrate, and an encapsulation layer that encapsulates the lead frame substrate and the integrated circuit device. In implementations, one process for fabricating the semiconductor package device includes placing an integrated circuit device on a lead frame substrate, where the lead frame substrate includes at least one lead frame contact pad and at least one sacrificial contact pad, and encapsulating the integrated circuit device and the lead frame substrate with an encapsulation layer.

19 Claims, 5 Drawing Sheets

SACRIFICIAL PAD ON SEMICONDUCTOR PACKAGE DEVICE AND METHOD

CROSS-REFERENCE TO RELATED APPLICATIONS

The present application claims the benefit under 35 U.S.C. §119(e) of U.S. Provisional Application Ser. No. 61/989,723, filed May 7, 2014, and titled "SACRIFICIAL PAD ON SEMICONDUCTOR PACKAGE DEVICE AND METHOD." U.S. Provisional Application Ser. No. 61/989,723 is herein incorporated by reference in its entirety.

BACKGROUND

Flat no-lead packaging technologies, such as quad-flat no-leads (QFN) packaging technologies, physically and electrically connect integrated circuit chips to printed circuit boards. Flat no-lead packaging technologies can employ a lead-frame that includes an integrated circuit chip (die) mounted thereon. The die may be electrically interconnected with the lead-frame through wire-bonding technology or flip-chip technology.

SUMMARY

A semiconductor package device, electronic device, and fabrication methods are described that include at least one sacrificial contact pad on the semiconductor package device for preventing and/or reducing stress on the semiconductor package device and solder connections and increasing board level reliability. In implementations, the semiconductor package device that employs example techniques in accordance with the present disclosure includes a lead frame substrate including at least one lead frame contact pad and at least one sacrificial contact pad, an integrated circuit device electrically coupled to the lead frame substrate, and an encapsulation layer that encapsulates the lead frame substrate and the integrated circuit device. Additionally, an electronic device can include a printed circuit board and a semiconductor package device, as described above, coupled to the printed circuit board. In implementations, one process for fabricating the semiconductor package device that employs example techniques in accordance with the present disclosure includes placing an integrated circuit device on a lead frame substrate, where the lead frame substrate includes at least one lead frame contact pad and at least one sacrificial contact pad, and encapsulating the integrated circuit device and the lead frame substrate with an encapsulation layer.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Wafer-level packaging is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

Devices that employ flat no-lead packaging technologies, such as QFN packaging technologies, provide mechanical protection to the integrated circuit chips (dies) contained within the device packages by fully encapsulating the integrated circuit chips within the package. However, semiconductor package devices (e.g., QFN packages) can be expensive to produce and typically provide relatively low pin counts (e.g., the pins of a QFN are typically located along the bottom edge). Often, wafer-level QFN packages can have reliability issues. For example, a QFN package or other device package may have high mechanical stresses placed on the electrically functional pads disposed on the bottom of the package device. This stress can result in stress-induced solder fatigue and/or solder cracks.

Accordingly, a semiconductor package device, electronic device, and fabrication methods are described that include at least one sacrificial contact pad on the semiconductor package device for preventing and/or reducing stress on the semiconductor package device and solder connections and increasing board level reliability. In implementations, the semiconductor package device that employs example techniques in accordance with the present disclosure includes a lead frame substrate including at least one lead frame contact pad and at least one sacrificial contact pad, an integrated circuit device electrically coupled to the lead frame substrate, and an encapsulation layer that encapsulates the lead frame substrate and the integrated circuit device. Additionally, an electronic device can include a printed circuit board and a semiconductor package device, as described above, coupled to the printed circuit board. In implementations, one process for fabricating the semiconductor package device that employs example techniques in accordance with the present disclosure includes placing an integrated circuit device on a lead frame substrate, where the lead frame substrate includes at least one lead frame contact pad and at least one sacrificial contact pad, and encapsulating the integrated circuit device and the lead frame substrate with an encapsulation layer.

Example Implementations

Figure 1A:
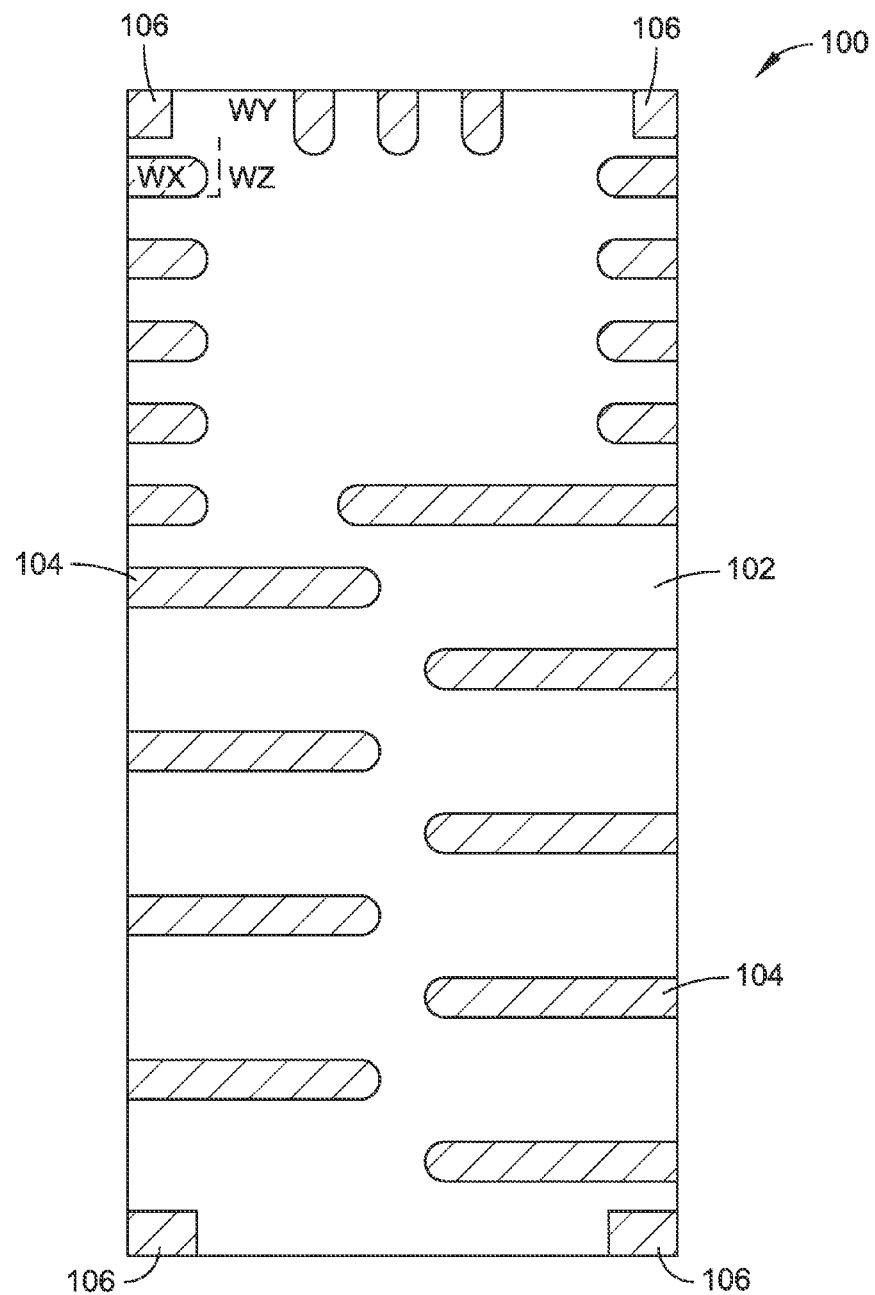
FIG. 1A is a diagrammatic plan view illustrating an embodiment of a semiconductor package device that includes at least one sacrificial contact pad, in accordance with an example implementation of the present disclosure.
Figure 1B:
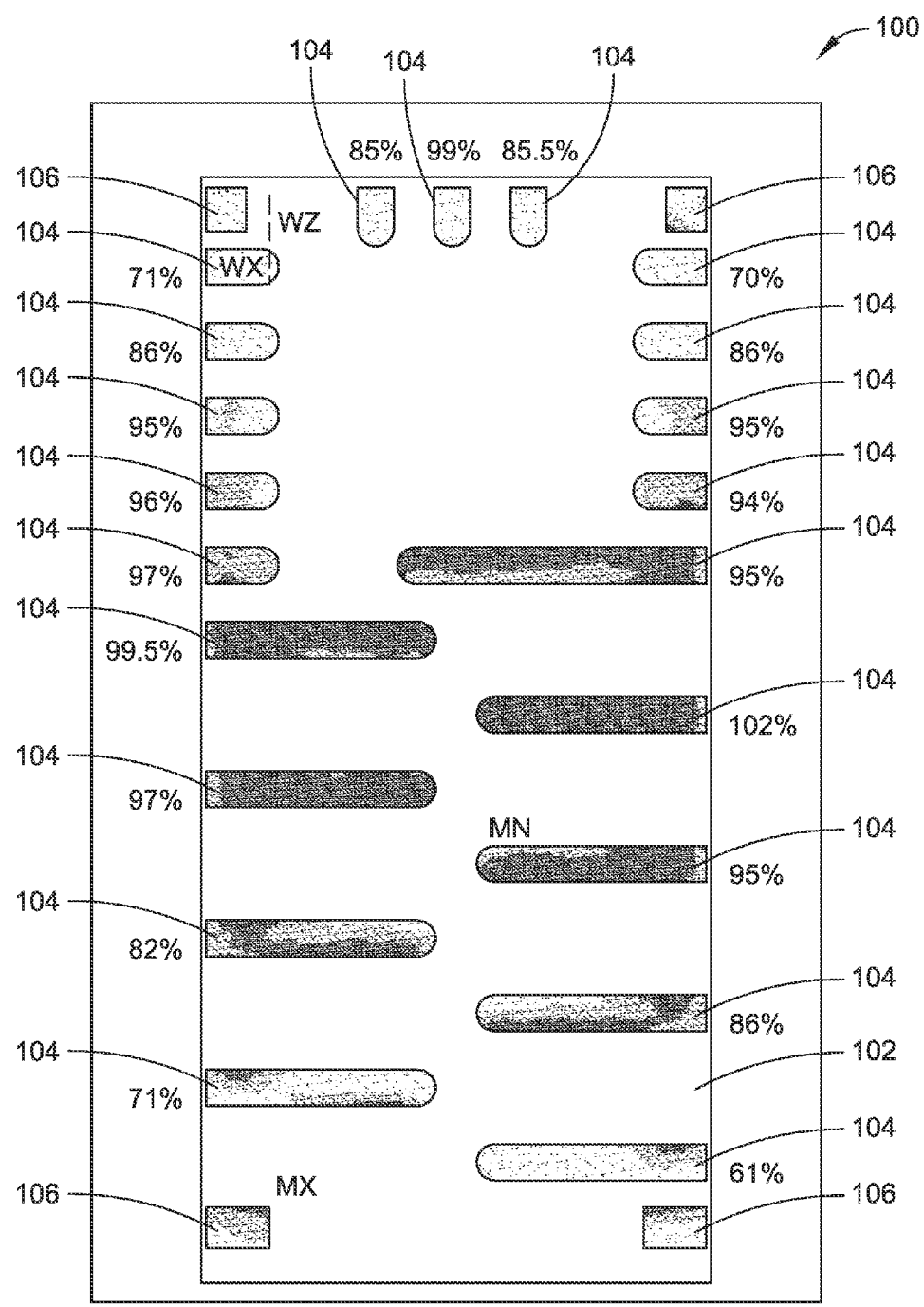
FIG. 1B is a diagrammatic plan view illustrating an embodiment of a semiconductor package device that includes at least one sacrificial contact pad, in accordance with an example implementation of the present disclosure.
Figure 1C:
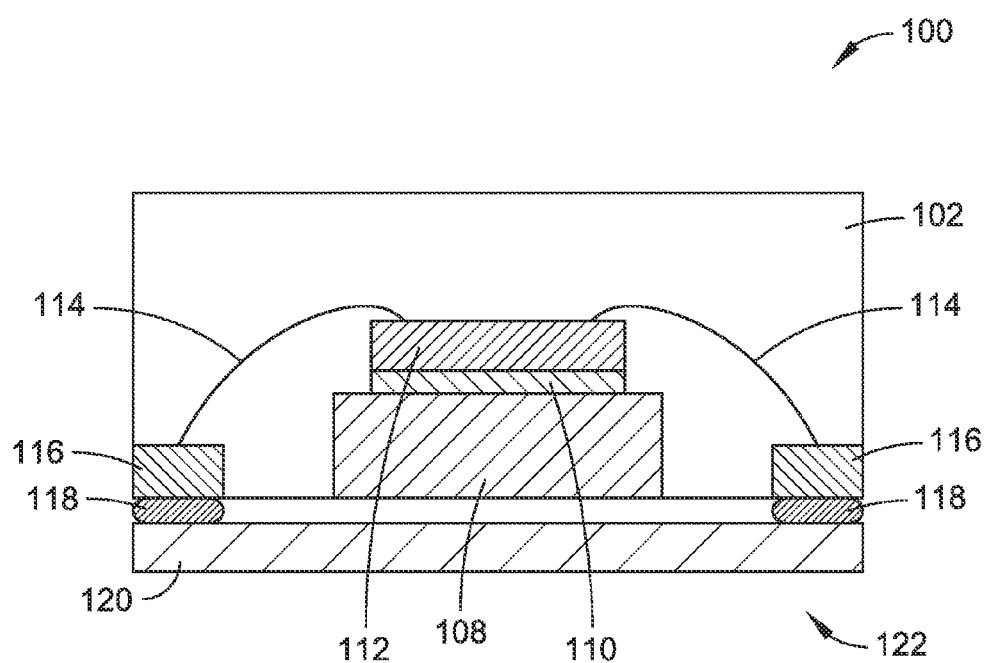
FIG. 1C is a cross sectional side view illustrating an embodiment of a semiconductor package device that includes at least one sacrificial contact pad, in accordance with an example implementation of the present disclosure.

FIGS. 1A through 1C illustrate a semiconductor package device 100 in accordance with an example implementation of the present disclosure. As shown in FIGS. 1A through 1C, the semiconductor package device 100 can include a lead frame substrate 116. In implementations, a lead frame substrate 116 can include a lead frame, which can further include a metal structure within the semiconductor package device 100 configured to carry an electronic signal from an integrated circuit device 112 to an external device, such as a printed circuit board 120. The integrated circuit device 112 can be coupled (e.g., glued) to the lead frame and lead frame substrate 116. In some examples, a lead frame may be manufactured by removing material from a flat plate of copper or copper-alloy. Subsequent to encapsulation of a lead frame, the outside section of the lead frame can be removed thereby forming separated leads. Other examples of lead frames can include a micro leadframe (MLP) and a small-outline no leads (SON) frame. In one example, a lead frame can includes a lead frame having a single row of contacts around the bottom edges in an exemplary QFN configuration. In another similar example, a lead frame can include a lead frame having a double row of contacts around the bottom edges of the semiconductor package device 100. In other examples, the semiconductor package device 100 can be assembled on a wafer level and not necessarily include a lead frame.

Some processes used to manufacture a lead frame can include etching (e.g., low volume lead frame fabrication) and/or stamping (e.g., high volume lead frame fabrication). In implementations, the lead frame substrate 116 includes at least one lead frame contact pad 104, which can include a portion of a lead on the lead frame that is configured to provide an electrical contact and/or an electrical signal to an outside device, such as a printed circuit board. In these implementations, the lead frame contact pad 104 can be exposed on the bottom (e.g., side configured to be adjacent to another device) of the semiconductor package device 100. In other implementations, a lead may be electrically coupled to a lead frame contact pad 104, and the lead frame contact pad 104 can be formed separately from the lead frame substrate 116. In this implementation, the lead frame contact pad 104 can include a metal and/or electrically conductive pad disposed on the bottom (e.g., side configured to be adjacent to another device) of the semiconductor package device 100.

The lead frame contact pad 104 can be disposed on the bottom of the device (e.g., the side configured to be disposed proximate to and coupled to another device). In one embodiment, the semiconductor package device 100 can include multiple lead frame contact pads 104 along the edge(s) of the bottom (e.g., the side configured to be disposed proximate to and coupled to an external device, such as the printed circuit board 120). In one specific embodiment, a semiconductor package device 100 includes lead frame contact pads 104 disposed along the edges of a bottom side of a quad flat no-leads (QFN) package where a portion of the lead frame contact pads 104 are smaller in size (e.g., length, width) than the other portion of the lead frame contact pads 104. In this embodiment, the size of the lead frame contact pads 104 can be determined based on the function of each pad (e.g., I/O, power, ground, electrical signals, etc.). For example, a semiconductor package device 100 can include a portion of lead frame contact pads 104 that are configured to provide power and are larger than another portion of the lead frame contact pads 104 that are configured to provide input/output (I/O). In other examples, the semiconductor package device 100 can include an array of lead frame contact pads 104 substantially the same size (e.g., I/O pads). In implementations, the lead frame contact pad 104 can be flush with the bottom surface of the semiconductor wafer device 100. In some other embodiments, the lead frame contact pad 104 can be exposed on the bottom and an adjacent side of the semiconductor package device 100.

The semiconductor package device 100 can include at least one sacrificial contact pad 106. In implementations, a sacrificial contact pad 106 can be disposed on a corner (e.g., where at least two sides and/or edges meet) of the bottom side (e.g., the side configured to be coupled to an external device, such as a printed circuit board 120) of the semiconductor package device 100. In other implementations, the sacrificial contact pad 106 can be disposed away from the corner of the semiconductor package device 100. For example, the sacrificial contact pad 106 can be disposed at the center edge(s) on the bottom of the semiconductor package device 100. As shown in FIG. 1B, including a sacrificial contact pad 106 disposed on at least one of the corners of the semiconductor package device 100 functions to alleviate stress on the electrically functional lead frame contact pads 104, shield the electrically functional lead frame contact pads 104, and improve board level reliability. FIG. 1B shows one specific example of the solder plasticity reduction at each pad location compared to a similar package without sacrificial contact pads 106. In one specific embodiment, a semiconductor package device 100 includes a QFN device having four sacrificial contact pads 106 with one sacrificial contact pad 106 disposed on each corner of the QFN device.

In some embodiments, the sacrificial contact pad 106 can be electrically non-functional and/or non-conductive. For example, the sacrificial contact pad 106 can include a polymer pad and be configured to only provide mechanical structure and stress reduction. In another specific example, the sacrificial contact pad 106 can include a metal pad while being electrically non-functional. In some embodiments, a sacrificial contact pad 106 can be connected to an adjacent lead frame contact pad 104 and can be electrically functional. For example, the sacrificial contact pad 106 can function as a ground or as a power source while providing mechanical support and stress reduction. In other embodiments, the sacrificial contact pad 106 can be thermally conductive. In these embodiments, the sacrificial contact pad 106 can function to conduct heat away from the semiconductor package device 100 while reducing stress on the semiconductor package device 100.

In implementations, an integrated circuit device 112 can include at least one integrated circuit (e.g., an integrated circuit die) that has been formed from and/or as a portion of a processed semiconductor wafer (not shown). The integrated circuit device 112 may include digital integrated circuits, analog integrated circuits, mixed-signal circuits, and so forth. In one or more implementations, the integrated circuit device 112 may include digital logic devices, analog devices (e.g., amplifiers, etc.), and combinations thereof, etc. In one specific embodiment shown in FIG. 1C, the semiconductor package device 100 includes an integrated circuit device 112 that can be placed on a die attach layer 110, where the die attach layer 110 is disposed on a thermal pad 108. In implementations, the die attach layer 110 can include a suitable adhesive configured to couple the integrated circuit device 112 to a thermal pad 108 or other substrate. In some implementations, the die attach layer 110 can include electrically conductive, non-electrically conductive, and/or thermally conductive adhesive(s). In some specific embodiments, the thermal pad 108 can include at least one via. The thermal pad 108 can be configured to remove heat from the semiconductor package device 100.

In some embodiments, the integrated circuit device 112 can be electrically connected to a lead frame substrate 116 using at least one wirebond 114. A wirebond 114 can include an electrical interconnection between the integrated circuit device 112 and a lead frame substrate 116, lead frame contact pad 104, and/or sacrificial contact pad 106. In implementations, the wirebond 114 can include a variety of conductive materials (e.g., gold, aluminum, copper, silver, etc.).

In another embodiment, the semiconductor package device 100 can include an integrated circuit device 112 having a flip-chip configuration. In this embodiment, the integrated circuit device 112 can be mechanically coupled (e.g., using a die attach) and electrically connected to the lead frame substrate 116 using at least one solder bump 118 and/or wirebond 114. A solder bump 118 can be formed on the surface of the integrated circuit device 112 in a flip-chip configuration where the integrated circuit device 100 is electrically coupled to the lead frame substrate 116. In implementations, a solder bump 118 can include materials that are suitable for soldering, for example lead-free metals such as a Tin-Silver-Copper (Sn—Ag—Cu) alloy (i.e., SAC), a Tin-Silver (Sn—Ag) alloy, a Tin-Copper (Sn—Cu) alloy, etc. In one specific embodiment, a Tin-Lead (PbSn) material may be used as the solder bump 118. Additionally, at least one solder bump 118 can be utilized to couple the semiconductor package device 100 to another device, such as a printed circuit board 120.

The integrated circuit device 112 may be fabricated utilizing various fabrication techniques. For example, the integrated circuit device 112 may be fabricated via complimentary metal-oxide-semiconductor (CMOS) techniques, bi-polar semiconductor techniques, and so on. The integrated circuit device 112 may include electrical interconnections formed therein (e.g., integrated circuits, redistribution layers, vias, contact pads, etc.). Additionally, the integrated circuit device 112 can include electrical interconnections (e.g., contacts pads, metal pads, such as copper and/or aluminum, under-ball metallization (UBM), etc.) configured to provide an electrical connection between the integrated circuit device 112 (by way of a redistribution layer, vias, solder bumps, and/or other electrical interconnections) and an external component (e.g., a printed circuit board 120). In implementations, the integrated circuit device 112 can include an active die (e.g., a processor) and/or a passive die (e.g., a capacitor, a transistor, etc.).

The semiconductor package device 100 can include an encapsulation layer 102 that encapsulates the integrated circuit device 112, the leadframe substrate 116, and/or wirebond(s) 114. As shown in FIG. 1C, the encapsulation layer 102 at least substantially encapsulates the integrated circuit device 112, the leadframe substrate 116, and/or wirebond(s) 114 and provides mechanical support, environmental protection, and electrical insulation for the semiconductor package device 100. In one implementation, the encapsulation layer 102 may include a polymer material, such as epoxy, deposited over the semiconductor package device 100. In some additional embodiments, the encapsulation layer 102 can include an air-cavity QFN or plastic molded QFN.

FIG. 1C illustrates a semiconductor package device 100 coupled with a printed circuit board 120. This view illustrates a cross-section side view of the semiconductor package device 100 shown in FIGS. 1A and 1B. In this view, at least one solder bump 118 can couple the semiconductor package device 100 using at least one lead frame contact pad 104 and/or sacrificial contact pad 106 to a printed circuit board 120 or other electrical device, which together form an electronic device 122.

Example Processes

Figure 2:
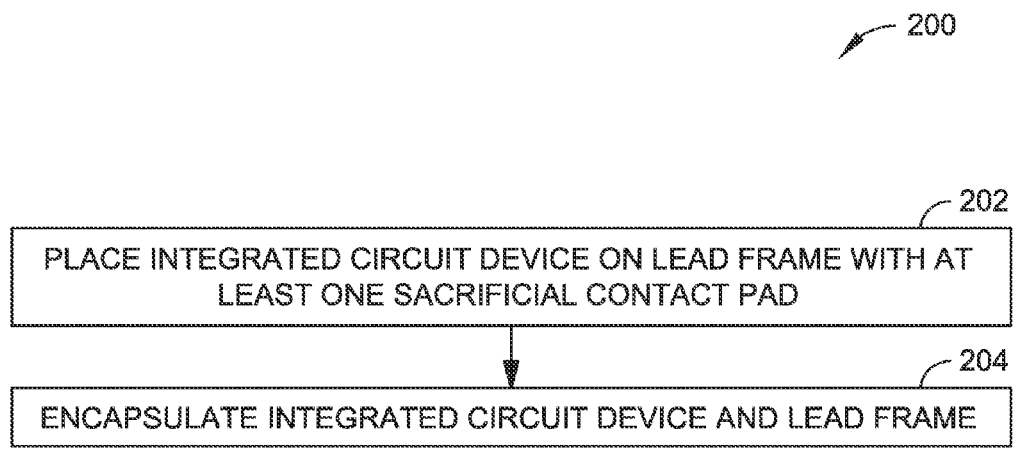
FIG. 2 is a flow diagram illustrating an example process for fabricating a semiconductor package device that includes at least one sacrificial contact pad, such as the semiconductor package device illustrated in FIGS. 1A through 1C.
Figure 3A:
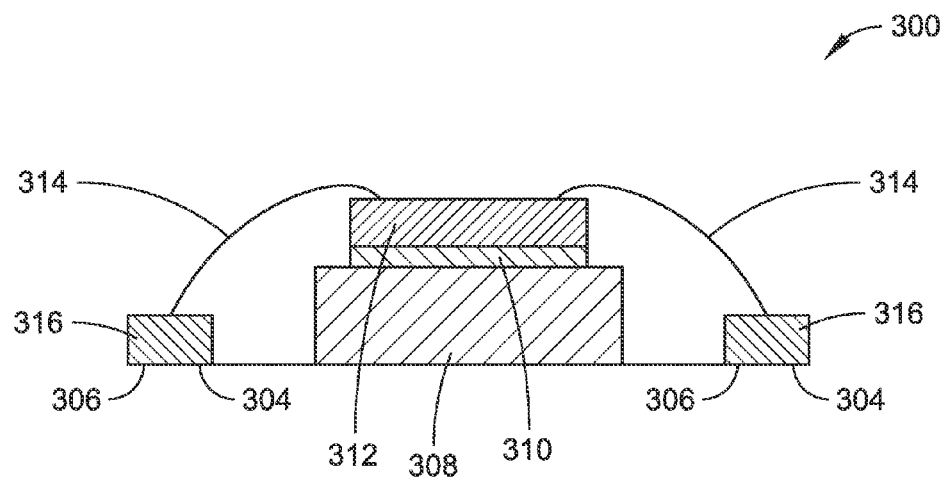
FIG. 3A is a diagrammatic partial cross-sectional side elevation view illustrating the fabrication of a semiconductor package device, such as the device shown in FIGS. 1A through 1C, in accordance with the process shown in FIG. 2.
Figure 3B:
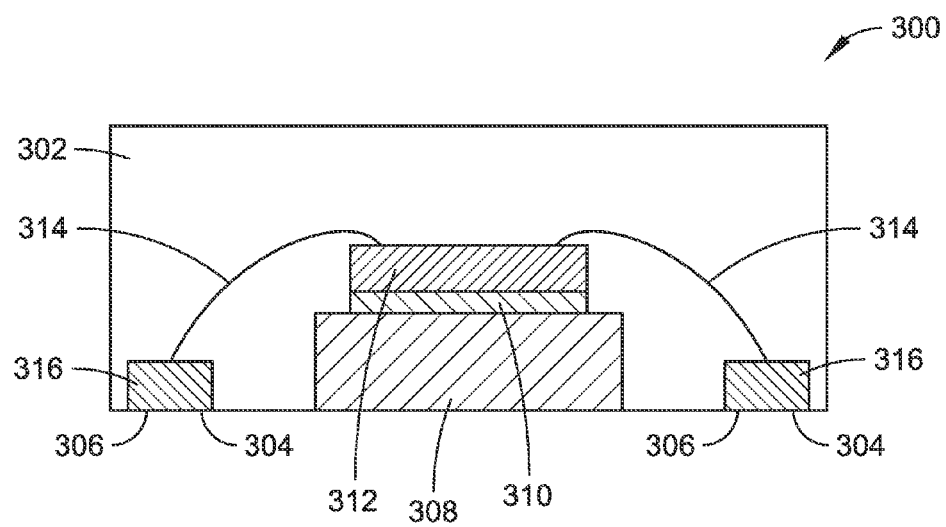
FIG. 3B is a diagrammatic partial cross-sectional side elevation view illustrating the fabrication of a semiconductor package device, such as the device shown in FIGS. 1A through 1C, in accordance with the process shown in FIG. 2.

FIG. 2 illustrates an example process 200 that employs a wafer level package device, such as the semiconductor package device 100 shown in FIGS. 1A through 1C. FIGS. 3A and 3B illustrate sections 300 of an example device that are utilized to fabricate semiconductor devices (such as semiconductor package device 100).

In the process 200 illustrated, an integrated circuit device is placed on a lead frame with at least one sacrificial contact pad (Block 202). In implementations, placing an integrated circuit device 312 on a lead frame substrate 316 can include using pick-and-place techniques or other suitable techniques. Pick-and-place technology may include using automated machines to place surface-mount devices (e.g., the integrated circuit device 312) onto a substrate (e.g., lead frame substrate 316). In one specific implementation, placing an integrated circuit device 312 includes using a pick-and-place process that places the integrated circuit device 312 on the lead frame substrate 316. In some embodiments, placing the integrated circuit device 312 may include placing the integrated circuit device 312 on a thermal pad 308 using a die attach 310 and/or other adhesive. In other embodiments, placing the integrated circuit device 312 may include coupling the integrated circuit device 312 directly on the lead frame substrate 316 utilizing at least one solder bump, such as in a flip-chip configuration. Additionally, placing the integrated circuit device 312 can include using a wirebonding process to electrically couple the integrated circuit device 312 to a lead frame contact pad 304 using at least one wirebond 314.

Then, the integrated circuit device and lead frame substrate are encapsulated by an encapsulation layer (Block 204). In implementations, encapsulating the integrated circuit device 312 and lead frame substrate 316 can include forming the encapsulation layer 302 over the surface the integrated circuit device 312 and lead frame substrate 316 subsequent to device interconnection to provide support and electrical insulation to the lead frame substrate 316, the integrated circuit device 312, the wirebonds 314, etc. In some embodiments, multiple polymer layers (e.g., epoxy, etc.) may be deposited and/or molded to form the encapsulation layer 302. Suitable encapsulation and/or molding processes may include injection molding and/or transfer molding. In some embodiments, an epoxy material may also be deposited on the backside (e.g., the surface configured to be coupled to another device) of the semiconductor package device 100 where the sacrificial contact pad(s) 306 and lead frame contact pad(s) 304 are exposed and/or subjected to a process to expose the lead frame contact pad(s) 304 (e.g., backgrinding). In some embodiments, the encapsulation layer 302 may be subjected to a grinding process or other removal process to expose the lead frame contact pad(s) 304 and/or sacrificial contact pad(s) 306.

Additional processes may be performed, such as attaching the semiconductor package device 100 to another electronic component (e.g., printed circuit board 120, etc.), reflowing the at least one solder bump 318, etc. Coupling the semiconductor package device 100 with another device (e.g., printed circuit board 120) can form an electronic device 122.

The disclosed semiconductor package device 100 can boost board-level temperature cycling performance and result in improved device reliability. In temperature cycling testing (e.g., where the semiconductor package device is attached to a printed circuit board with solder), solder layers on small pads adjacent to the corner in conventional devices (e.g., a QFN) can be vulnerable due to proximity to the corners. These solder connections proximate to the semiconductor package device 100 corners often break first, and the device can fail the temperature cycling test. However, when the solder connections on the sacrificial contact pad(s) 106 break instead of on the other electrically functional lead frame contact pad(s) 104, semiconductor package device 100 function is not affected.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor package device, comprising:
   a lead frame substrate including at least one lead frame contact pad and at least one sacrificial contact pad that is electrically nonconductive;
   an integrated circuit device electrically coupled to the lead frame substrate; and
   an encapsulation layer that encapsulates the lead frame substrate and the integrated circuit device.

2. The semiconductor package device of claim 1, wherein the at least one sacrificial contact pad is disposed on at least one corner of the semiconductor package device.

3. The semiconductor package device of claim 1, wherein the at least one sacrificial contact pad is disposed on a non-corner section of the semiconductor package device.

4. The semiconductor package device of claim 1, wherein at least one sacrificial contact pad is electrically conductive.

5. The semiconductor package device of claim 4, wherein at least one electrically conductive sacrificial contact pad is configured as a ground.

6. The semiconductor package device of claim 4, wherein at least one electrically conductive sacrificial contact pad is configured as a power source.

7. The semiconductor package device of claim 1, wherein at least one sacrificial contact pad is thermally conductive.

8. The semiconductor package device of claim 1, wherein the encapsulation layer includes an epoxy-based resin.

9. The semiconductor package device of claim 1, wherein the semiconductor package device includes a quad flat no-leads configuration package.

10. An electronic device, comprising:
    a printed circuit board; and
    a semiconductor package device coupled to the printed circuit board, the semiconductor package device including
      a lead frame substrate including at least one lead frame contact pad and at least one sacrificial contact pad;
      an integrated circuit device electrically connected to the lead frame substrate; and
      an encapsulation layer that encapsulates the lead frame substrate and the integrated circuit device.

11. The electronic device of claim 10, wherein the at least one sacrificial contact pad is disposed on a corner of the semiconductor package device.

12. The electronic device of claim 10, wherein the at least one sacrificial contact pad is electrically non-conductive.

13. The electronic device of claim 10, wherein the at least one sacrificial contact pad is electrically conductive.

14. The electronic device of claim 10, wherein the at least one sacrificial contact pad is thermally conductive.

15. A process for fabricating a semiconductor package device with at least one sacrificial pad, comprising:
    placing an integrated circuit device on a lead frame substrate, where the lead frame substrate includes at least one lead frame contact pad and at least one sacrificial contact pad; and
    encapsulating the integrated circuit device and the lead frame substrate with an encapsulation layer.

16. The process of claim 15, wherein the at least one sacrificial contact pad is disposed on at least one corner of the semiconductor package device.

17. The process of claim 15, wherein the at least one sacrificial contact pad is electrically non-conductive.

18. The process of claim 15, wherein the at least one sacrificial contact pad is electrically conductive.

19. The process of claim 15, wherein the at least one sacrificial contact pad is thermally conductive.

* * * * *